(12) United States Patent
Ershov (10) Patent No.: US 8,604,452 B2
(45) Date of Patent: Dec. 10, 2013

(54) DRIVE LASER DELIVERY SYSTEMS FOR EUV LIGHT SOURCE

(75) Inventor: Alexander I. Ershov, Escondido, CA (US)

(73) Assignee: Cymer, LLC, San Diego, CA (US)

(*) Notice: Subject to any disclaimer, the term of this patent is extended or adjusted under 35 U.S.C. 154(b) by 186 days.

(21) Appl. No.: 13/050,198

(22) Filed: Mar. 17, 2011

(65) Prior Publication Data
US 2012/0235066 A1 Sep. 20, 2012

(51) Int. Cl.
*G21K 5/04* (2006.01)

(52) U.S. Cl.
USPC .................................. 250/504 R; 250/493.1

(58) Field of Classification Search
USPC ............... 250/504 R, 493.1, 494.1, 503.1; 359/196.1, 198.1, 237, 350, 352, 204.5
See application file for complete search history.

(56) References Cited

U.S. PATENT DOCUMENTS

| | | | |
|---|---|---|---|
| 7,087,914 B2 | 8/2006 | Akins et al. | |
| 7,164,144 B2 | 1/2007 | Partlo et al. | |
| 7,177,330 B2 | 2/2007 | Wai | |
| 7,372,056 B2 | 5/2008 | Bykanov et al. | |
| 7,405,416 B2 | 7/2008 | Algots et al. | |
| 7,439,530 B2 | 10/2008 | Ershov et al. | |
| 7,443,903 B2 | 10/2008 | Leonardo | |
| 7,465,946 B2 | 12/2008 | Bowering et al. | |
| 7,491,954 B2 | 2/2009 | Bykanov et al. | |
| 7,518,787 B2 | 4/2009 | Bykanov et al. | |
| 7,598,509 B2 | 10/2009 | Ershov et al. | |
| 7,812,329 B2 | 10/2010 | Bykanov | |
| 7,843,632 B2 | 11/2010 | Bowering | |
| 7,872,245 B2 | 1/2011 | Vaschenko et al. | |
| 7,897,947 B2 | 3/2011 | Vaschenko | |
| 7,928,416 B2 | 4/2011 | Fomenkov | |
| 8,256,441 B2 | 9/2012 | Moriya | |
| 2005/0286035 A1* | 12/2005 | Troost et al. | 355/67 |
| 2006/0255298 A1 | 11/2006 | Bykanov | |
| 2007/0263269 A1* | 11/2007 | Flagello | 359/35 |
| 2008/0036984 A1* | 2/2008 | Mos et al. | 355/53 |
| 2010/0140512 A1 | 6/2010 | Suganuma | |
| 2010/0193710 A1 | 8/2010 | Wakabayashi | |
| 2010/0220756 A1 | 9/2010 | Krzysztof | |
| 2010/0294953 A1 | 11/2010 | Vaschenko et al. | |
| 2012/0012762 A1* | 1/2012 | Nowak et al. | 250/504 R |

OTHER PUBLICATIONS

U.S. Appl. No. 12/638,092, filed Dec. 15, 2009.
PCT International Search Report dated Jun. 20, 2012 from International Application No. PCT/US2012/027026, filed Feb. 28, 2012 (3 pgs).
Written Opinion from PCT International Search Report dated Jun. 20, 2012 from International Application No. PCT/US2012/027026, filed Feb. 28, 2012 (6 pgs).

* cited by examiner

*Primary Examiner* — Nicole Ippolito
(74) *Attorney, Agent, or Firm* — Cymer, LLC (57) ABSTRACT

An EUV light source is disclosed herein which may comprise a droplet generator producing a stream of target material droplets, a first optical gain medium amplifying light on a first beam path without a seed laser providing a seed laser output to the first beam path, a second optical gain medium amplifying light on a second beam path without a seed laser providing a seed laser output to the second beam path, and a beam combiner combining light from the first beam path and the second beam path for interaction with a target material droplet to produce EUV light emitting plasma.

20 Claims, 5 Drawing Sheets

DRIVE LASER DELIVERY SYSTEMS FOR EUV LIGHT SOURCE

CROSS-REFERENCE TO RELATED APPLICATIONS

The present application is related to U.S. patent application Ser. No. 11/580,414, filed on Oct. 13, 2006, now U.S. Pat. No. 7,491,954, issued on Feb. 17, 2009, entitled DRIVE LASER DELIVERY SYSTEMS FOR EUV LIGHT SOURCE.

The present application is also related to U.S. patent application Ser. No. 11/358,992, entitled LASER PRODUCED PLASMA EUV LIGHT SOURCE, filed on Feb. 21, 2006, now U.S. Pat. No. 7,598,509, issued on Oct. 6, 2009, the entire contents of which are hereby incorporated by reference herein.

The present application is also related to U.S. patent application Ser. No. 11/174,299, entitled LPP EUV LIGHT SOURCE DRIVE LASER SYSTEM, filed on Jun. 29, 2005, now U.S. Pat. No. 7,439,530, issued on Oct. 21, 2008, the entire contents of which are hereby incorporated by reference herein.

The present application is also related to U.S. patent application Ser. No. 11/452,558, entitled DRIVE LASER FOR EUV LIGHT SOURCE, filed on Jun. 14, 2006, now U.S. Pat. No. 7,518,717, issued on Apr. 14, 2009, the entire contents of which are hereby incorporated by reference herein.

FIELD

The present application relates to extreme ultraviolet ("EUV") light sources and their methods of operation. These light sources provide EUV light by creating plasma from a source material. In one application, the EUV light may be collected and used in a photolithography process to produce semiconductor integrated circuits.

BACKGROUND

A patterned beam of EUV light can be used to expose a resist coated substrate, such as a silicon wafer, to produce extremely small features in the substrate. Extreme ultraviolet light (also sometimes referred to as soft x-rays) is generally defined as electromagnetic radiation having wavelengths in the range of about 5-100 nm. One particular wavelength of interest for photolithography occurs at 13.5 nm and efforts are currently underway to produce light in the range of 13.5 nm+/−2% which is commonly referred to as "in band EUV" for 13.5 nm systems.

Methods to produce EUV light include, but are not necessarily limited to, converting a source material into a plasma state that has a chemical element with an emission line in the EUV range. These elements can include, but are not necessarily limited to xenon, lithium and tin.

In one such method, often termed laser produced plasma ("LPP"), the required plasma can be produced by irradiating a source material, for example in the form of a droplet, stream or wire, with a laser beam. In another method, often termed discharge produced plasma ("DPP"), the required plasma can be generated by positioning source material having an EUV emission line between a pair of electrodes and causing an electrical discharge to occur between the electrodes.

As indicated above, one technique to produce EUV light involves irradiating a source material. In this regard, $CO_2$ lasers outputting light at infra-red wavelengths, i.e., wavelengths in the range of about 9 μm to 11 μm, may present certain advantages as a so-called 'drive' laser irradiating a source material in an LPP process. This may be especially true for certain source materials, for example, source materials containing tin. One advantage may include the ability to produce a relatively high conversion efficiency between the drive laser input power and the output EUV power.

Generally, for an LPP light source, EUV output power scales with the drive laser power. It has been suggested to employ an Oscillator—Amplifier arrangement to produce relatively high power laser pulses used in the LPP process. For example, in some arrangements, a multi-chamber amplifier having a one-pass small signal gain in the order of $1 \times 10^5$ or more may be seeded with the output of a somewhat fragile oscillator (seed laser) which may include one or more relatively sensitive optics. In fact, for some setups, the amplifier gain is so high that a polarization discriminating optical isolator, which may, for example, stop about 90-99 percent of back-propagating light, may be insufficient to protect the oscillator from damage. Meeting future demands for increased EUV output with an Oscillator—Amplifier arrangement would require an even larger amplifier, which in turn, would even further endanger fragile oscillator optics. As used herein, the term "seed laser" and its derivatives means a laser, the output of which is injected into some amplifier, or another laser.

Figure 1:
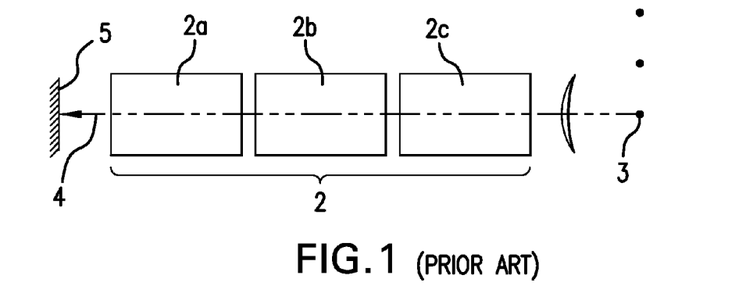
FIG. 1 shows a schematic view of a prior art apparatus for irradiating droplets with a laser beam produced by an optical amplifier that is not seeded by an oscillator.

It has also been previously suggested to irradiate droplets with a laser beam produced by an optical amplifier that is not seeded by a seed laser. FIG. 1 shows an arrangement in which an EUV light source has an optical amplifier 2 having a chain of amplifier chambers 2a-c arranged in series. In use, a droplet of target material 3 is placed on a trajectory passing through a beam path 4 extending through the amplifier. When the droplet reaches the beam path 4, some photons on the beam path are reflected through the amplifier chain between the droplet and optic 5. This then produces an amplified beam which irradiates the droplet and produces EUV light emitting plasma. For this process, an optical amplifier having a relatively high gain is typically employed. This high gain, however, may be problematic in some cases. Specifically, so-called 'self-lasing' may occur before the droplet reaches the beam path 4 due to reflections and/or diffraction from vessel walls, debris from a previously irradiated droplet, optical mounts in the amplifier chain, or in the optics between the amplifier chain and irradiation site, a gate valve separating the EUV light source from a downstream exposure tool, other structures in the chamber and/or on-axis reflections from a drive laser focusing lens.

The amount of self lasing is proportional to amplifier gain and can undesirably deplete amplifier gain needed to produce a target irradiation beam. Meeting future demands for increased EUV output with the unseeded amplifier arrangement shown in FIG. 1 would require an amplifier with even larger gain, which in turn, would cause increased self lasing.

With the above in mind, Applicant discloses Drive Laser Delivery Systems for EUV Light Source.

SUMMARY

As disclosed herein, in a first aspect, an EUV light source may comprise a droplet generator producing a stream of target material droplets, a first optical gain medium amplifying light on a first beam path without a seed laser providing a seed laser output to the first beam path, a second optical gain medium amplifying light on a second beam path without a seed laser providing a seed laser output to the second beam path, and a beam combiner combining light from the first beam path and the second beam path for interaction with a target material droplet to produce EUV light emitting plasma.

In one embodiment of this aspect, the EUV light source may further comprise a third optical gain medium amplifying light on the first beam path and the second beam path.

In a particular embodiment of this aspect, the EUV light source may further comprise an optic and wherein the first optical gain medium is positioned on the first beam path between the optic and the beam combiner.

In one implementation of this aspect, the optic is a first optic, the beam combiner is a first beam combiner and the EUV light source may further comprise a second optic and a second beam combiner, the second beam combiner positioned on the first beam path between the first optic and the first optical gain medium to combine light travelling from the first optic and the second optic.

In a particular implementation of this aspect, the first optic comprises a mirror.

In one arrangement of this aspect, the first optic comprises a grating.

In a particular setup of this aspect, the grating defines a groove direction and the EUV light source further comprises an actuator coupled with the grating to rotate the groove direction about the first beam path.

In one embodiment of this aspect, the first optic comprises a grating and the second optic comprises a grating.

In a particular embodiment of this aspect, the EUV light source further comprises a variable attenuator attenuating light on the first beam path.

In one embodiment of this aspect, the variable attenuator comprises a polarization compensation device.

In an embodiment of this aspect, the beam combiner comprises a polarization beam combiner.

In another aspect, also disclosed herein, an EUV light source may comprise a first optical gain medium amplifying light on a first beam path, a second optical gain medium amplifying light on a second beam path, a first beam combiner diverting a portion of light from the first beam path to a second beam path and through the second optical gain medium, and a second beam combiner combining light on the first beam path and the second beam path to irradiate a target material and generate EUV light emitting plasma.

In one embodiment of this aspect, the EUV light source may further comprise a third optical gain medium amplifying photons on the first beam path and the second beam path.

In a particular embodiment of this aspect, the EUV light source may further comprise a variable attenuator attenuating light on the first beam path.

In a particular implementation of this aspect, the variable attenuator comprises a polarization compensation device.

In one implementation of this aspect, the beam combiner comprises a polarization beam combiner.

In another aspect, also disclosed herein, a method for generating EUV light may comprise the steps of: amplifying light on a first beam path with a first optical gain medium, amplifying light on a second beam path with a second optical gain medium, diverting a portion of light from the first beam path to a second beam path and through the second optical gain medium, and combining light on the first beam path and the second beam path to irradiate a target material and generate EUV light emitting plasma.

In a particular implementation of this aspect, the method may further comprise the step of amplifying photons on the first beam path and the second beam path with a third optical gain medium.

In one implementation of this aspect, the method may further comprise the step of attenuating light on the first beam path with a variable attenuator.

In a particular implementation of this aspect, the diverting step may be accomplished with a polarization beam combiner.

DETAILED DESCRIPTION

Figure 2:
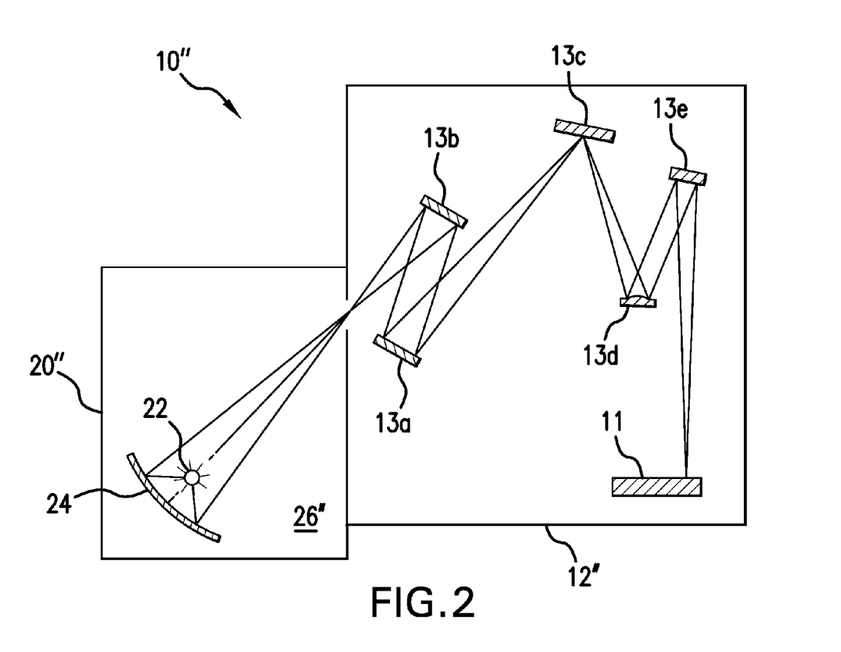
FIG. 2 shows a simplified schematic view of an EUV light source coupled with an exposure device.

With initial reference to FIG. 2, there is shown a simplified, schematic, sectional view of selected portions of one example of an EUV photolithography apparatus, generally designated 10". The apparatus 10" may be used, for example, to expose a substrate 11 such as a resist coated wafer with a patterned beam of EUV light. For the apparatus 10", an exposure device 12" utilizing EUV light, (e.g., an integrated circuit lithography tool such as a stepper, scanner, step and scan system, direct write system, device using a contact and/or proximity mask, etc. . . . ) may be provided having one or more optics 13a,b, for example, to illuminate a patterning optic 13c with a beam of EUV light, such as a reticle, to produce a patterned beam, and one or more reduction projection optic(s) 13d, 13e, for projecting the patterned beam onto the substrate 11. A mechanical assembly (not shown) may be provided for generating a controlled relative movement between the substrate 11 and patterning means 13c. As further shown in FIG. 2, the apparatus 10" may include an EUV light source 20" including an EUV light radiator 22 emitting EUV light in a chamber 26" that is reflected by optic 24 along a path into the exposure device 12" to irradiate the substrate 11.

As used herein, the term "optic" and its derivatives is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic" nor its derivatives, as used herein, are meant to be limited to components which operate solely or to advantage within one or more specific wavelength range(s) such as at the EUV output light wavelength, the irradiation laser wavelength, a wavelength suitable for metrology or any other specific wavelength.

Figure 3:
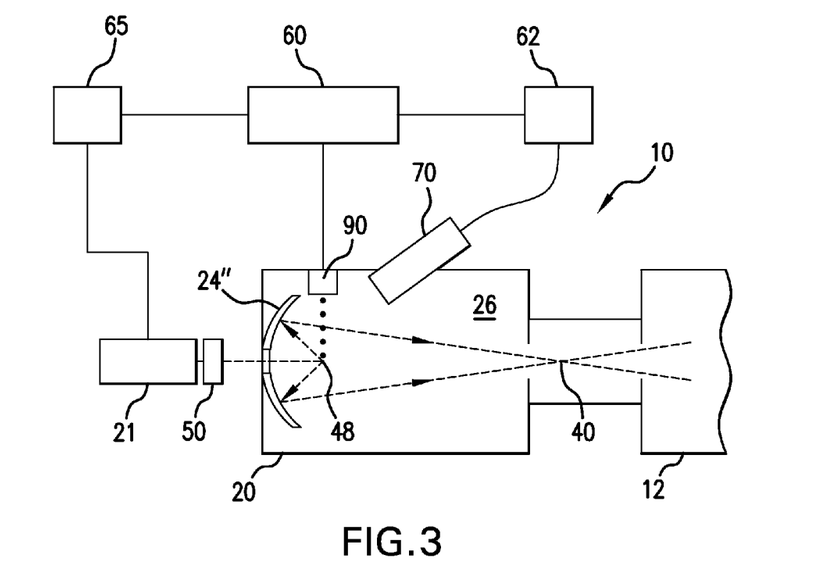
FIG. 3 shows a simplified, schematic diagram of an apparatus including an EUV light source having an LPP EUV light radiator.

FIG. 3 illustrates a specific example of an apparatus 10 including an EUV light source 20 having an LPP EUV light radiator. As shown, the EUV light source 20 may include a system 21 for generating a train of light pulses and delivering the light pulses into a light source chamber 26. For the apparatus 10, the light pulses may travel along one or more beam paths from the system 21 and into the chamber 26 to illuminate source material at an irradiation region 48 to produce an EUV light output for substrate exposure in the exposure device 12.

Suitable lasers for use in the system 21 shown in FIG. 3 include, but are not necessarily limited to, the arrangements shown in FIGS. 4-7 and described in further detail below.

FIG. 3 also shows that the apparatus 10 may include a beam conditioning unit 50 having one or more optics for beam conditioning such as expanding, steering, and/or focusing the beam between the laser source system 21 and irradiation site 48. For example, a steering system, which may include one or more mirrors, prisms, lenses, etc., may be provided and arranged to steer the laser focal spot to different locations in the chamber 26. For example, the steering system may include a first flat mirror mounted on a tip-tilt actuator which may move the first mirror independently in two dimensions, and a second flat mirror mounted on a tip-tilt actuator which may move the second mirror independently in two dimensions. With this arrangement, the steering system may controllably move the focal spot in directions substantially orthogonal to the direction of beam propagation (beam axis).

The beam conditioning unit 50 may include a focusing assembly to focus the beam to the irradiation site 48 and adjust the position of the focal spot along the beam axis. For the focusing assembly, an optic such as a focusing lens or mirror may be used that is coupled to an actuator for movement in a direction along the beam axis to move the focal spot along the beam axis.

Further details regarding beam conditioning systems are provided in U.S. patent application Ser. No. 10/803,526, filed on Mar. 17, 2004, entitled A HIGH REPETITION RATE LASER PRODUCED PLASMA EUV LIGHT SOURCE, now U.S. Pat. No. 7,087,914, issued on Aug. 8, 2006; U.S. Ser. No. 10/900,839 filed on Jul. 27, 2004, entitled EUV LIGHT SOURCE, now U.S. Pat. No. 7,164,144, issued on Jan. 16, 2007; and U.S. patent application Ser. No. 12/638,092, filed on Dec. 15, 2009, entitled BEAM TRANSPORT SYSTEM FOR EXTREME ULTRAVIOLET LIGHT SOURCE, the contents of each of which are hereby incorporated by reference.

As further shown in FIG. 3, the EUV light source 20 may also include a source material delivery system 90, e.g., delivering source material, such as tin droplets, into the interior of chamber 26 to an irradiation region 48, where the droplets will interact with light pulses from the system 21, to ultimately produce plasma and generate an EUV emission to expose a substrate such as a resist coated wafer in the exposure device 12. More details regarding various droplet dispenser configurations and their relative advantages may be found in U.S. patent application Ser. No. 12/721,317, filed on Mar. 10, 2010, and published on Nov. 25, 2010, as US 2010-0294953-A1, entitled LASER PRODUCED PLASMA EUV LIGHT SOURCE; U.S. Ser. No. 12/214,736, filed on Jun. 19, 2008, now U.S. Pat. No. 7,872,245, issued on Jan. 18, 2011, entitled SYSTEMS AND METHODS FOR TARGET MATERIAL DELIVERY IN A LASER PRODUCED PLASMA EUV LIGHT SOURCE; U.S. patent application Ser. No. 11/827,803, filed on Jul. 13, 2007, entitled LASER PRODUCED PLASMA EUV LIGHT SOURCE HAVING A DROPLET STREAM PRODUCED USING A MODULATED DISTURBANCE WAVE; U.S. patent application Ser. No. 11/358,988, filed on Feb. 21, 2006, entitled LASER PRODUCED PLASMA EUV LIGHT SOURCE WITH PRE-PULSE, and published on Nov. 16, 2006 as US2006/0255298A-1; U.S. patent application Ser. No. 11/067,124, filed on Feb. 25, 2005, entitled METHOD AND APPARATUS FOR EUV PLASMA SOURCE TARGET DELIVERY; now U.S. Pat. No. 7,405,416, issued on Jul. 29, 2008; and U.S. patent application Ser. No. 11/174,443, filed on Jun. 29, 2005, entitled LPP EUV PLASMA SOURCE MATERIAL TARGET DELIVERY SYSTEM, now U.S. Pat. No. 7,372,056, issued on May 13, 2008; the contents of each of which are hereby incorporated by reference.

The source material for producing an EUV light output for substrate exposure may include, but is not necessarily limited to, a material that includes tin, lithium, xenon or combinations thereof. The EUV emitting element, e.g., lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$ as a tin alloy, e.g., tin-gallium alloys, tin-indium alloys, tin-indium-gallium alloys, or a combination thereof. Depending on the material used, the source material may be presented to the irradiation region at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in U.S. patent application Ser. No. 11/406,216, filed on Apr. 17, 2006, entitled ALTERNATIVE FUELS FOR EUV LIGHT SOURCE, now U.S. Pat. No. 7,465,946, issued on Dec. 16, 2008, the contents of which are hereby incorporated by reference herein.

Continuing with reference to FIG. 3, the apparatus 10 may also include an EUV controller 60, which may also include a drive laser control system 65 for controlling devices in the system 21 to thereby generate light pulses for delivery into the chamber 26, and/or for controlling movement of optics in the beam conditioning unit 50. The apparatus 10 may also include a droplet position detection system which may include one or more droplet imagers 70 that provide an output indicative of the position of one or more droplets, e.g., relative to the irradiation region 48. The imager(s) 70 may provide this output to a droplet position detection feedback system 62, which can, e.g., compute a droplet position and trajectory, from which a droplet error can be computed, e.g., on a droplet-by-droplet basis, or on average. The droplet error may then be provided as an input to the controller 60, which can, for example, provide a position, direction and/or timing signal to the system 21 to control laser operation and/or to control movement of optics in the beam conditioning unit 50, e.g., to change the location and/or focal power of the light pulses being delivered to the irradiation region 48 in the chamber 26. Also for the EUV light source 20, the source material delivery system 90 may have a control system operable in response to a signal (which in some implementations may include the droplet error described above, or some quantity derived therefrom) from the controller 60, to e.g., modify the release point, initial droplet stream direction, droplet release timing and/or droplet modulation to correct for errors in the droplets arriving at the desired irradiation region 48.

Continuing with FIG. 3, the apparatus 10 may also include an optic 24" such as a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers. FIG. 3 shows that the optic 24" may be formed with an aperture to allow the light pulses generated by the system 21 to pass through and reach the irradiation region 48. As shown, the optic 24" may be, e.g., a prolate spheroid mirror that has a first focus within or near the irradiation region 48 and a second focus at a so-called intermediate region 40, where the EUV light may be output from the EUV light source 20 and input to an exposure device 12 utilizing EUV light, e.g., an integrated circuit lithography tool. It is to be appreciated that other optics may be used in place of the prolate spheroid mirror for collecting and directing light to an intermediate location for subsequent delivery to a device utilizing EUV light. For example, the optic may be a parabola rotated about its major axis or may be configured to deliver a beam having a ring-shaped cross-section to an intermediate location, see e.g., U.S. patent application Ser. No. 11/505,177, filed on Aug. 16, 2006, now U.S. Pat. No. 7,843,632, issued on Nov. 30, 2010, entitled EUV OPTICS, the contents of which are hereby incorporated by reference.

A buffer gas such as hydrogen, helium, argon or combinations thereof, may be introduced into, replenished and/or removed from the chamber 26. The buffer gas may be present in the chamber 26 during plasma discharge and may act to slow plasma created ions to reduce optic degradation and/or increase plasma efficiency. Alternatively, a magnetic field and/or electric field (not shown) may be used alone, or in combination with a buffer gas, to reduce fast ion damage.

Figure 4:
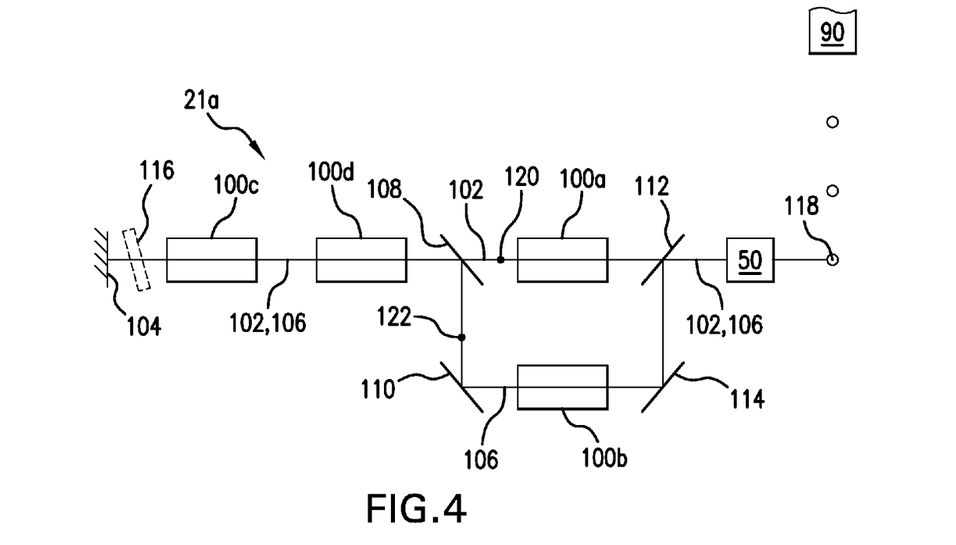
FIG. 4 shows a simplified, schematic diagram of an embodiment of a laser system for use in the apparatus shown in FIG. 3.

FIG. 4 shows an embodiment of a laser system 21a for use in the apparatus 10 shown in FIG. 3. As shown, the laser system 21a may include an optical amplification unit 100a amplifying photons on beam path 102. As shown, an optic 104 may be positioned on beam path 102 directing light which is incident on the optic 104 from beam path 102 back onto beam path 102. For example, the optic 104 may be a flat mirror, curved mirror, phase-conjugate mirror, grating, (see also FIGS. 5, 6 and corresponding description below) or corner reflector.

FIG. 4 also shows that an optical amplification unit 100b may be provided amplifying photons on beam path 106. As shown, a polarization beam combiner 108 may be positioned to transmit photons travelling from amplification unit 100a and having a first linear polarization direction toward optic 104 and reflect photons from amplification unit 100b (after reflection from mirror 110) having a linear polarization direction orthogonal to the first linear polarization direction toward optic 104. It is to be appreciated that the polarization beam combiners described herein may also function as beam splitters. For example, polarization beam combiner 108 may direct light having the first linear polarization direction that is incident upon polarization beam combiner 108 from optic 104 toward amplification unit 100a and direct photons travelling from optic 104 and having a linear polarization direction orthogonal to the first linear polarization direction through amplification unit 100b (after reflection from mirror 110). Suitable polarization beam combiners may be obtained from II-VI Incorporated, 375 Saxonburg Blvd, Saxonburg, Pa. 16056.

FIG. 4 also shows that a polarization beam combiner 112 may be positioned to direct photons travelling from amplification unit 100a and having the first linear polarization direction toward the beam conditioning unit 50, and direct photons travelling from amplification unit 100b (after reflection from mirror 114) toward the beam conditioning unit 50. Additional amplification units (not shown) may be positioned on the beam path 102 between the beam combiner 108 and beam combiner 112 and/or on the beam path 106 between the beam combiner 108 and beam combiner 112. For example, two amplification units (not shown) may be positioned on the beam path 102 between the beam combiner 108 and beam combiner 112 and two amplification units (not shown) may be positioned on the beam path 106 between the beam combiner 108 and beam combiner 112.

It can be further seen from FIG. 4 that additional amplification units 100c,d may be positioned on the beam path 102, 106 between the optic 104 and beam combiner 108 as shown. Although two amplification units 100c,d between the optic 104 and beam combiner 108 are shown, it is to be appreciated that more than two and as few as zero amplification units 100c,d between the optic 104 and beam combiner 108 may be employed.

FIG. 4 also shows that an optional variable attenuator 116 can be provided to introduce small variable loss into selected beam polarizations to equalize the power flow between amplification unit 100a and amplification unit 100b. For example, optional variable attenuator 116 may include a ZnSe plate which is coated to reflect a few percent (such as 10%) of one particular linear polarization direction. For example, the plate may be configured to transmit 90% of a first linear polarization direction and 100% of a linear polarization direction orthogonal to the first linear polarization direction. An actuator (not shown) may be provided to rotate the coated ZnSe plate about an optical axis collinear with the beam path 102, 106 to adjust the loss in one or both of the linear polarization directions. For example, this adjustment may be made to equalize the power flow between the beam path 102 and beam path 106.

Alternatively, or in addition to the optional variable attenuator 116, a variable attenuator may be positioned in beam path 102, for example at location 120, and/or a variable attenuator may be positioned in beam path 106, for example at location 122 to equalize the power flow between the beam path 102 and beam path 106. These variable attenuators could be of similar design as attenuator 116 or can be of any other design known in the pertinent art suitable for attenuating a light beam. For example, a ZnSe plate having a plurality of areas with each area coated to provide a different level of transmission may be employed. The different levels of attenuation may then be achieved by translating or rotating the ZnSe plate relative to the beam, causing the beam to pass through a selected area. In some cases, a variable attenuator may not be required.

For the laser system 21a shown in FIG. 4, each amplification unit 100a-d may include a filling gas that includes $CO_2$ gas. An optical gain medium may be established in an amplification unit by pumping the filling gas to create a population inversion using DC or RF excitation. In one particular implementation, the amplification unit may include an axial-flow, RF-pumped (continuous or with pulse modulation) $CO_2$ amplification unit. Other types of amplification units having fiber, rod, slab or disk-shaped gain media may be used. In some cases, a material other than a $CO_2$ filling gas may be employed in the amplification unit such as an excimer or molecular fluorine filling gas or a solid state material. In one particular implementation, each beam path 102, 106 may include a plurality, such as four or five, axial-flow, RF-pumped (continuous or pulsed) $CO_2$ amplification units having a total gain length of about 10-25 meters, and operating, in concert, at relatively high power, e.g., 10 kW or higher and high pulse repetition rate, e.g., 50 kHz or more.

Laser systems producing an amplified photon beam for irradiating a stream of droplets are disclosed and claimed in U.S. patent application Ser. No. 11/580,414 filed on Oct. 13, 2006, entitled, DRIVE LASER DELIVERY SYSTEMS FOR EUV LIGHT SOURCE, now U.S. Pat. No. 7,491,954, issued on Feb. 17, 2009, the entire contents of which are hereby incorporated by reference herein.

In some cases, the amplification units 100a-d may have different filling gas pressures and/or compositions such that small signal gain ($g_o$) decreases in the amplification unit chain toward the droplet stream. Thus, amplification unit 100a may have a smaller signal gain ($g_o$) than amplification unit 100c. More specifically, amplification unit 100c may have a gain medium characterized by a saturation energy ($E_{s, 100c}$) and a small signal gain ($g_{o, 100c}$); and the amplification unit 100d may have a gain medium characterized by a saturation energy ($E_{s, 100d}$) and a small signal gain ($g_{o, 100d}$); and the amplification unit 100c may have a gain medium characterized by a saturation energy ($E_{s, 100c}$) and a small signal gain ($g_{o, 100c}$), with ($g_{o, 100a}$)<($g_{o, 100d}$)<($g_{o, 100c}$) and ($E_{s, 100a}$)>($E_{s, 100d}$)>($E_{s, 100c}$). In some arrangements, laser system 21 may be configured such that amplification unit 100a has a small signal gain ($g_{o, 100a}$) that is the same or approximately the same as the small signal gain ($g_{o, 100b}$) of amplification unit 100b. Alternatively, amplification units 100a and 100b may have different filling gas pressures and/or compositions such that small signal gain ($g_o$) of amplification unit 100a has a small signal gain ($g_{o, 100a}$) that is different from the small signal gain ($g_{o, 100b}$) of amplification unit 100b. This may be done, for example, to equalize the power flow between the beam path 102 and beam path 106. More details regarding the optimization of an amplifier chain may be found in U.S. Pat. No. 7,518,787, issued on Apr. 14, 2009, entitled DRIVE LASER FOR EUV LIGHT SOURCE, the entire contents of which are hereby incorporated by reference herein.

In use, a target material droplet 118 from source material delivery system 90 is placed on a trajectory passing near or through beam path 102, 106 to direct light which is incident on the droplet 118 from beam path 102, 106 back onto beam path 102, 106. When the droplet 118 is near or on the beam path 102, 106, photons having the first linear polarization direction are able to travel back and forth between the droplet 118 and optic 104 establishing an optical cavity along beam path 102. On path 102, photons having the first linear polarization direction pass through amplification units 100a, 100c, and 100d producing an amplified photon beam on beam path 102 without a seed laser providing output photons to beam path 102.

Also, when the droplet is near or on the beam path 102, 106, photons having a polarization orthogonal to the first linear polarization direction are able to travel back and forth between the droplet 118 and optic 104 establishing an optical cavity along beam path 106. On path 106, photons having a polarization orthogonal to the first linear polarization direction pass through amplification units 100b, 100c, and 100d producing an amplified photon beam on beam path 106 without a seed laser providing output photons to beam path 106.

Amplified photon beam on beam path 102 is combined with amplified photon beam on beam path 106 at beam combiner 112 and the combined beam is directed through beam conditioning unit 50 where the beam is focused onto the droplet 118 producing EUV light emitting plasma.

In some instances, source material, such as a droplet, may be irradiated by a pre-pulse prior to reaching beam path 102, 106. The pre-pulse may, for example, heat, expand, gasify, vaporize, ionize and/or generate a weak plasma. Some or all of the pre-pulse affected material may then reach beam path 102, 106, be irradiated by an amplified photon beam on beam path 102, 106 (as described above) and thereby produce an EUV light emission.

Figure 5:
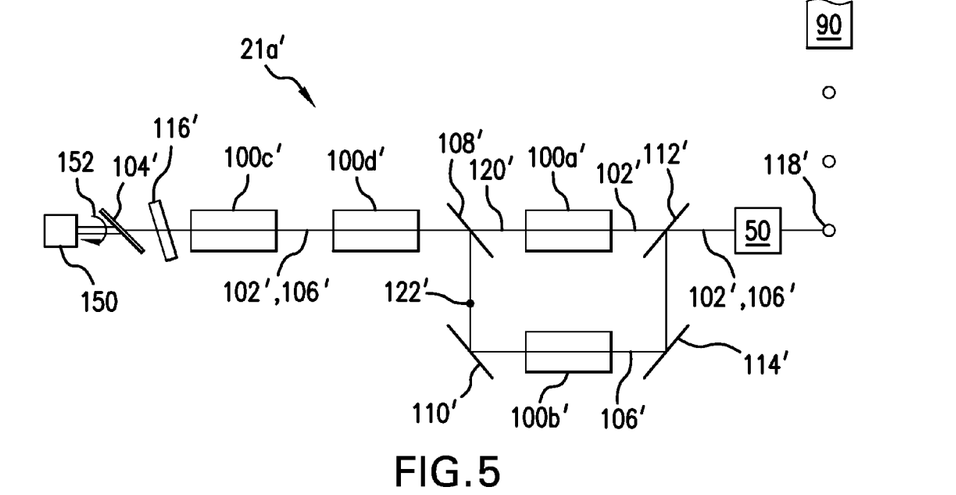
FIG. 5 shows a simplified, schematic diagram of another embodiment of a laser system for use in the apparatus shown in FIG. 3.

FIG. 5 shows another embodiment of a laser system 21a' for use in the apparatus 10 shown in FIG. 3. As shown, the laser system 21a' may include an optical amplification unit 100a' amplifying photons on beam path 102'. As shown, an optic 104' may be positioned on beam path 102' directing light which is incident on the optic 104' from beam path 102' back onto beam path 102'.

FIG. 5 also shows that an optical amplification unit 100b' (as described above with reference to FIG. 4) may be provided amplifying photons on beam path 106', polarization beam combiner 108' (as described above with reference to FIG. 4) may be positioned to direct photons travelling from optic 104' and having a first linear polarization direction through amplification unit 100a', and direct photons travelling from optic 104' and having a linear polarization direction orthogonal to the first linear polarization direction through amplification unit 100b' after reflection from mirror 110'.

FIG. 5 also shows that a polarization beam combiner 112' (as described above with reference to FIG. 4) may be positioned to direct photons travelling from amplification unit 100a' and having the first linear polarization direction toward the beam conditioning unit 50, and direct photons travelling from amplification unit 100b' (after reflection from mirror 114') toward the beam conditioning unit 50. It can be further seen from FIG. 5 that additional amplification units 100c', 100d' may be positioned on the beam path 102', 106' between the optic 104' and beam combiner 108' as shown.

FIG. 5 also shows that an optional variable attenuator 116' (as described above with reference to FIG. 4) can be provided to introduce small variable loss into selected beam polarizations to equalize the power flow between amplification unit 100a' and amplification unit 100b'. Alternatively, or in addition to the optional variable attenuator 116', a variable attenuator, (as described above with reference to FIG. 4) may be positioned in beam path 102', for example, at location 120', and/or a variable attenuator, may be positioned in beam path 106', for example, at location 122' to equalize the power flow between the beam path 102' and beam path 106'. In some cases, a variable attenuator may not be required.

For the laser system 21a', the optic 104' may be a blazed eschelle type grating disposed in a littrow configuration relative to the beam path 102', 106'. For this arrangement, the grating may have a slightly different reflection efficiency for light having the first linear polarization direction, than light having a linear polarization direction orthogonal to the first linear polarization direction. Moreover, an actuator 150 may be coupled to the grating to rotate the grating about the axis defined by beam path 102' and beam path 106' (as shown by arrow 152) to adjust the angle between the first linear polarization direction and the grooves of the grating. Rotation of the grating in this manner can be used to change the reflection efficiencies for light having the first linear polarization direction and light having a linear polarization direction orthogonal to the first linear polarization direction. For example, this adjustment may be made to equalize the power flow between the 102' beam path and 106' beam path.

In use, a target material droplet 118' from source material delivery system 90 is placed on a trajectory passing near or through beam path 102', 106' to direct light which is incident on the droplet 118' from beam path 102', 106' back onto beam path 102', 106'. When the droplet is near or on the beam path 102', 106', photons having the first linear polarization direction are able to travel back and forth between the droplet 118' and optic 104' establishing an optical cavity along beam path 102'. On path 102', photons having the first linear polarization direction pass through amplification units 100a', 100c', and 100d' producing an amplified photon beam on beam path 102' without a seed laser providing output photons to beam path 102'.

Also, when the droplet 118' is near or on the beam path 102', 106', photons having a polarization orthogonal to the first linear polarization direction are able to travel back and forth between the droplet 118' and optic 104' establishing an optical cavity along beam path 106'. On beam path 106', photons having a polarization orthogonal to the first linear polarization direction pass through amplification units 100b', 100c', and 100d' producing an amplified photon beam on beam path 106' without a seed laser providing output photons to beam path 106'.

Amplified photon beam on beam path 102' is combined with amplified photon beam on beam path 106' at beam combiner 112', and the combined beam is directed through beam conditioning unit 50, where the beam is focused onto the droplet 118' producing EUV light emitting plasma.

Figure 6:
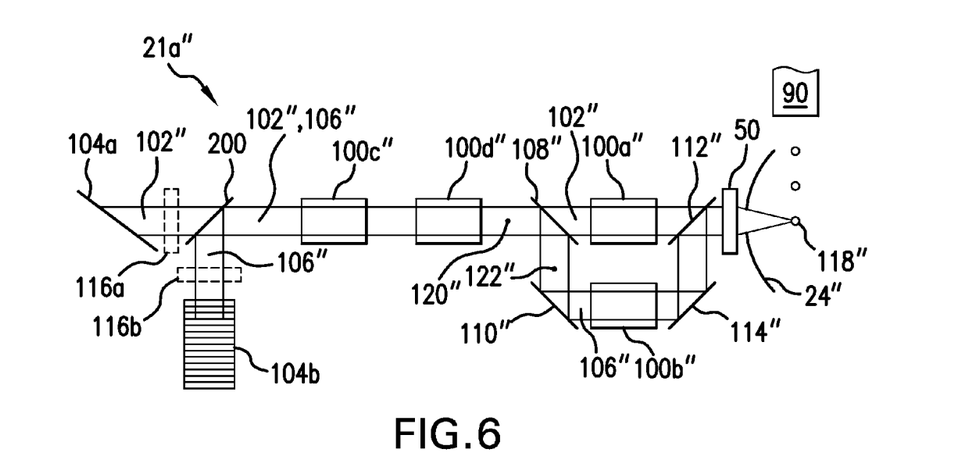
FIG. 6 shows a simplified, schematic diagram of another embodiment of a laser system for use in the apparatus shown in FIG. 3.

FIG. 6 shows another embodiment of a laser system 21a" for use in the apparatus 10 shown in FIG. 3. As shown, the laser system 21a" may include an optical amplification unit 100a" amplifying photons on beam path 102".

Also shown, an optic 104a may be positioned on beam path 102" directing light which is incident on the optic 104a from beam path 102" back onto beam path 102". A polarization beam combiner 200 (as described above with reference to FIG. 4) may be positioned on beam path 102" to transmit photons travelling from optic 104a and having a first linear polarization direction and reflect photons from optic 104b having a linear polarization direction orthogonal to the first linear polarization.

FIG. 6 also shows that an optical amplification unit 100b" (as described above with reference to FIG. 4) may be provided amplifying photons on beam path 106", polarization beam combiner 108" (as described above with reference to FIG. 4) may be positioned to direct photons travelling from optic 104a and having a first linear polarization direction through amplification unit 100a", and direct photons travelling from optic 104b and having a linear polarization direction orthogonal to the first linear polarization direction through amplification unit 100b" after reflection from mirror 110".

FIG. 6 also shows that a polarization beam combiner 112" (as described above with reference to FIG. 4) may be positioned to direct photons travelling from amplification unit 100a" and having the first linear polarization direction toward the beam conditioning unit 50, and direct photons travelling from amplification unit 100b" (after reflection from mirror 114") toward the beam conditioning unit 50. It can be further seen from FIG. 6 that additional amplification units 100c"', 100d"' may be positioned on the beam path 102", 106" between the beam combiner 200 and beam combiner 108" as shown.

FIG. 6 also shows that an optional variable attenuator 116a (as described above with reference to FIG. 4) can be positioned on beam path 102" between the beam combiner 200 and optic 104a to introduce small variable loss into selected beam polarizations to equalize the power flow between amplification unit 100a" and amplification unit 100b". Alternatively, or in addition to the optional variable attenuator 116a, an optional variable attenuator 116b (as described above with reference to FIG. 4) can be positioned on beam path 106" between the beam combiner 200 and optic 104b to introduce small variable loss into selected beam polarizations to equalize the power flow between amplification unit 100a" and amplification unit 100b". Alternatively, or in addition to the optional variable attenuators 116a, 116b, a variable attenuator, (as described above with reference to FIG. 4) may be positioned in beam path 102", for example, at location 120", and/or a variable attenuator, may be positioned in beam path 106", for example, at location 122" to equalize the power flow between the beam path 102" and beam path 106". In some cases, a variable attenuator may not be required.

For the laser system 21a", the optic 104a may be a blazed eschelle type grating disposed in a littrow configuration relative to the beam path 102" and oriented for maximum or near maximum reflectivity of light having the first linear polarization direction. Also, the optic 104b may be a blazed eschelle type grating disposed in a littrow configuration relative to the beam path 106" and oriented for maximum or near maximum reflectivity of light having a linear polarization direction orthogonal to the first linear polarization direction. Alternatively, or in addition to the optional variable attenuators described above, for some arrangements, when gratings are used, actuator(s) (not shown) may be coupled to one or both of the optics 104a, 104b to rotate the grating(s) (as described above with reference to FIG. 5) to adjust the angle between the polarization direction and the grooves of the grating to change the reflection efficiencies of the optics 104a, 1046.

In use, a target material droplet 118" from source material delivery system 90 is placed on a trajectory passing near or through beam path 102", 106" to direct light which is incident on the droplet 118" from beam path 102", 106" back onto beam path 102", 106". When the droplet is near or on the beam path 102", 106", photons having the first linear polarization direction are able to travel back and forth between the droplet 118" and optic 104a establishing an optical cavity along beam path 102". On path 102", photons having the first linear polarization direction pass through amplification units 100a", 100c", and 100d" producing an amplified photon beam on beam path 102" without a seed laser providing output photons to beam path 102".

Also, when the droplet 118" is near or on the beam path 102", 106", photons having a polarization orthogonal to the first linear polarization direction are able to travel back and forth between the droplet 118" and optic 104b establishing an optical cavity along beam path 106". On beam path 106", photons having a polarization orthogonal to the first linear polarization direction pass through amplification units 100b", 100c", and 100d" producing an amplified photon beam on beam path 106" without a seed laser providing output photons to beam path 106".

Amplified photon beam on beam path 102" is combined with amplified photon beam on beam path 106" at beam combiner 112" and the combined beam is directed through beam conditioning unit 50 where the beam is focused onto the droplet 118" producing EUV light emitting plasma.

Figure 7:
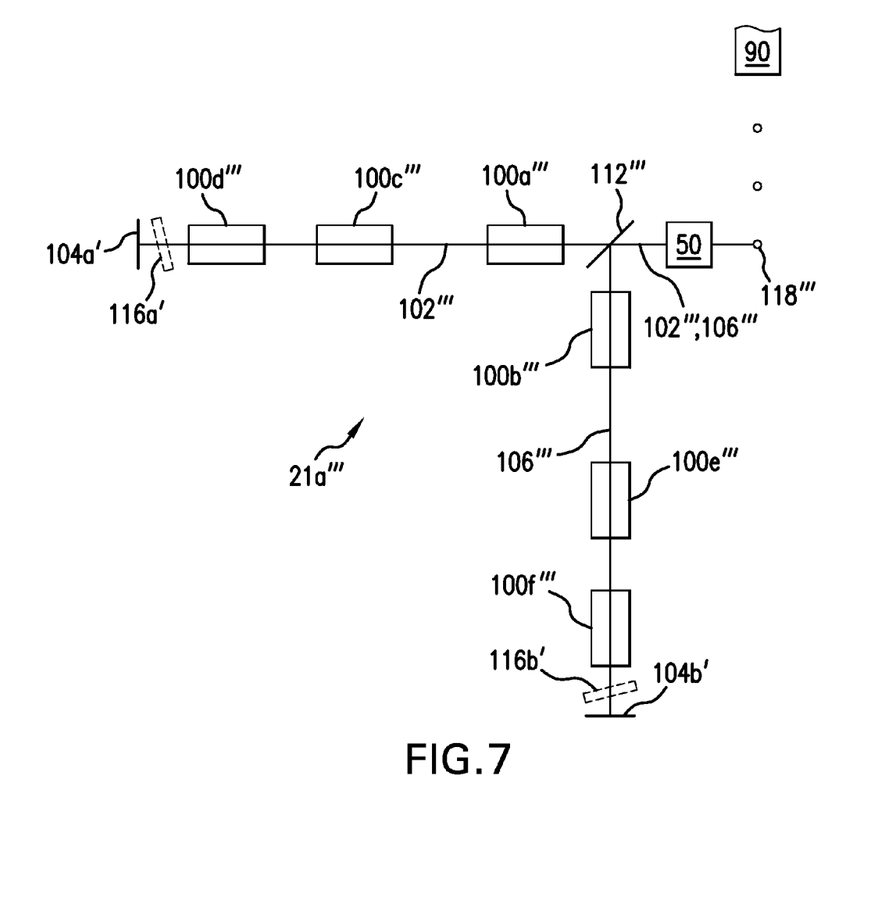
FIG. 7 shows a simplified, schematic diagram of another embodiment of a laser system for use in the apparatus shown in FIG. 3.

FIG. 7 shows another embodiment of a laser system 21a'" for use in the apparatus 10 shown in FIG. 3. As shown, the laser system 21a'" may include optical amplification units 100a'", 100c'", 100d'" amplifying photons on beam path 102'". Also shown, an optic 104a' may be positioned on beam path 102'" directing light which is incident on the optic 104a' from beam path 102'" back onto beam path 102'". FIG. 7 also shows that optical amplification units 100b'" 100e'", 100f'" (as described above with reference to FIG. 4) may be provided amplifying photons on beam path 106'. Also shown, an optic 104b' may be positioned on beam path 106'" directing light which is incident on the optic 104b' from beam path 106'" back onto beam path 106'. Also, a polarization beam combiner 112" (as described above with reference to FIG. 4) may be positioned to direct photons travelling from optic 104a' and having a first linear polarization direction through beam conditioning unit 50 (after passing through optical amplification units 100a''', 100c''', 100d''') and direct photons travelling from optic 104b' and having a linear polarization direction orthogonal to the first linear polarization direction through beam conditioning unit 50 (after passing through optical amplification units 100b''', 100e''', 100f'''). Although three amplification units 100a''', 100c''', 100d''' between the optic 104a' and beam combiner 112''' are shown, it is to be appreciated that more than three, and as few as one, amplification unit(s) between the optic 104a' and beam combiner 112''' may be employed. Although three amplification units 100b''', 100e''', 100f''' between the optic 104b' and beam combiner 112''' are shown, it is to be appreciated that more than three, and as few as one, amplification unit(s) between the optic 104b' and beam combiner 112''' may be employed.

FIG. 7 also shows that an optional variable attenuator 116a' (as described above with reference to FIG. 4) can be positioned on beam path 102''' between the beam combiner 112''' and optic 104a' to introduce small variable loss into selected beam polarizations to equalize the power flow between amplification units 100a''', 100c''', 100d''' and amplification units 100b''', 100e''', 100f'''. Alternatively, or in addition to the optional variable attenuator 116a', an optional variable attenuator 116b' (as described above with reference to FIG. 4) can be positioned on beam path 106''' between the beam combiner 112''' and optic 104b' to introduce small variable loss into selected beam polarizations to equalize the power flow between amplification units 100a''', 100c''', 100d''' and amplification units 100b''', 100e''', 100f'''. In some cases, a variable attenuator may not be required.

For the laser system 21a''', the optic 104a' may be, for example, a flat mirror (see FIG. 4), curved mirror, phase-conjugate mirror, corner reflector or a grating such as a blazed eschelle type grating disposed in a littrow configuration relative to the beam path 102''' (see FIG. 6 and corresponding description above). The optic 104b' may be, for example, a flat mirror (see FIG. 4), curved mirror, phase-conjugate mirror, corner reflector or a grating such as a blazed eschelle type grating disposed in a littrow configuration relative to the beam path 106''' (see FIG. 6 and corresponding description above). The type of optic used for optic 104a' may be the same or different than the type of optic used for optic 104b'. If gratings are used, actuator(s) (not shown) may be coupled to one or both of the optics 104a', 104b' to rotate the grating (as described above with reference to FIG. 5) to adjust the angle between the linear polarization direction and the grooves of the grating to change the reflection efficiencies of the optics 104a', 104b'.

In use, a target material droplet 118''' from source material delivery system 90 is placed on a trajectory passing near or through beam path 102''', 106''' to direct light which is incident on the droplet 118''' from beam path 102''', 106''' back onto beam path 102''', 106'''. When the droplet is near or on the beam path 102''', 106''', photons having the first linear polarization direction are able to travel back and forth between the droplet 118''' and optic 104a' establishing an optical cavity along beam path 102'''. On path 102''', photons having the first linear polarization direction pass through amplification units 100a''', 100c''', and 100d''' producing an amplified photon beam on beam path 102''' without a seed laser providing output photons to beam path 102'''.

Also, when the droplet 118''' is near or on the beam path 102''', 106''', photons having a linear polarization orthogonal to the first linear polarization direction are able to travel back and forth between the droplet 118''' and optic 104b' establishing an optical cavity along beam path 106'''. On beam path 106''', photons having a polarization orthogonal to the first linear polarization direction pass through amplification units 100b''', 100e''', and 100f''' producing an amplified photon beam on beam path 106''' without a seed laser providing output photons to beam path 106'''.

Amplified photon beam on beam path 102''' is combined with amplified photon beam on beam path 106''' at beam combiner 112''' and the combined beam is directed through beam conditioning unit 50 where the beam is focused onto the droplet 118''' producing EUV light emitting plasma.

Figure 8:
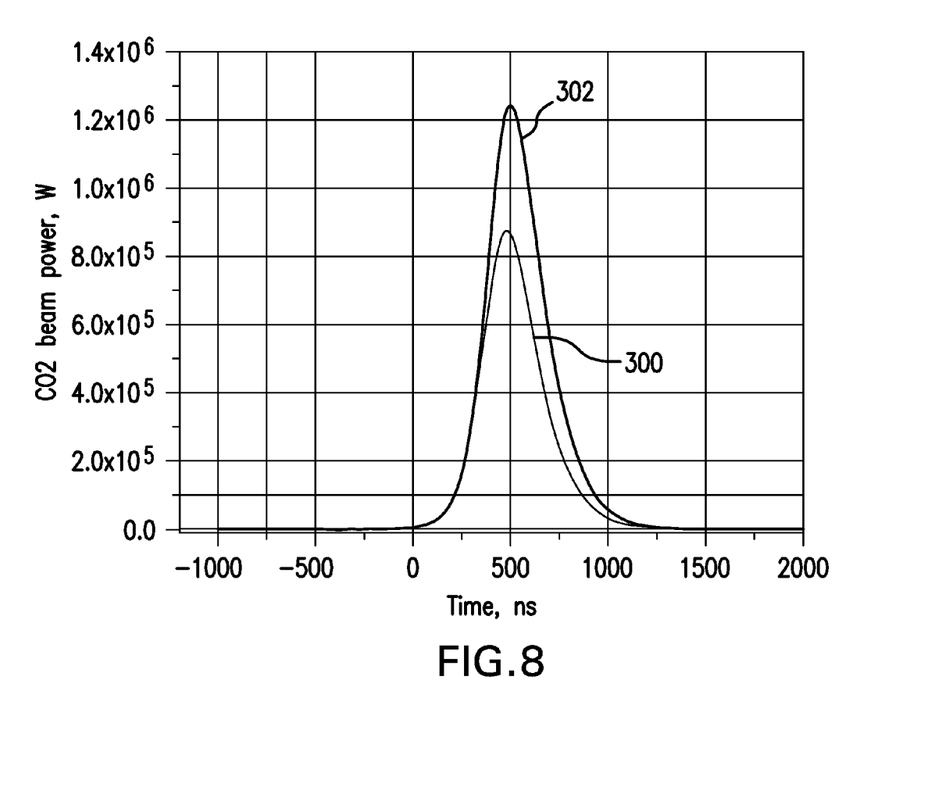
FIG. 8 is a plot comparing the calculated beam power of the embodiment shown in FIG. 4 to the calculated beam power of the prior art arrangement shown in FIG. 1.

FIG. 8 shows a plot of the estimated beam power achievable for the embodiment shown in FIG. 4 (curve 302) in which the optical amplification units 100a and 100b each have a small signal gain of approximately 0.5 $m^{-1}$ optical amplification unit 100e has a small signal gain of approximately 0.8 $m^{-1}$ and optical amplification unit 100d has a small signal gain of approximately 1.1 $m^{-1}$. As shown in FIG. 8, this arrangement may result in a calculated, full-width half maximum (FWHM) pulse energy of about 462.0 mJ. FIG. 8 also shows a plot of the estimated beam power achievable for the prior art arrangement shown in FIG. 1 (curve 300) in which the optical amplification unit 2a has a small signal gain of approximately 1.1 $m^{-1}$ optical amplification unit 2b has a small signal gain of approximately 0.8 $m^{-1}$ and optical amplification unit 2c has a small signal gain of approximately 0.5 $m^{-1}$. As shown in FIG. 8, this arrangement may result in a calculated, full-width half maximum (FWHM) pulse energy of about 324.3.0 mJ.

It will be understood by those skilled in the art that the embodiments described above are intended to be examples only and are not intended to limit the scope of the subject matter which is broadly contemplated by the present application. It is to be appreciated by those skilled in the art that additions, deletions and modifications may be made to the disclosed embodiments within the scope of the subject matter disclosed herein. The appended claims are intended in scope and meaning to cover not only the disclosed embodiments but also such equivalents and other modifications and changes that would be apparent to those skilled in the art. Unless explicitly stated otherwise, reference to an element in the following Claims in the singular or a reference to an element preceded by the article "a" is intended to mean "one or more" of said element(s). None of the disclosure provided herein is intended to be dedicated to the public regardless of whether the disclosure is explicitly recited in the Claims.

I claim:

1. An EUV light source comprising;
   a droplet generator producing a stream of target material droplets;
   a first optical gain medium amplifying light on a first beam path without a seed laser providing a seed laser output to the first beam path, said light on said first beam path having a first linear polarization direction, said first beam path being part of a first optical cavity disposed between a target material irradiation site and a first optics;
   a second optical gain medium amplifying light on a second beam path without a seed laser providing a seed laser output to the second beam path, said light on said second beam path having a second linear polarization direction orthogonal to said first linear polarization direction, said second beam path being part of a second optical cavity disposed between said target material irradiation site and said first optics; and
   a beam combiner combining light from said first beam path and said second beam path such that said light, after said combining, interacts with a target material droplet at said target material irradiation site to produce EUV light emitting plasma.

2. An EUV light source as recited in claim 1 further comprising a third optical gain medium amplifying light on the first beam path and the second beam path.

3. An EUV light source as recited in claim 1 wherein said first optical gain medium is positioned on said first beam path between the first optic and the beam combiner.

4. An EUV light source as recited in claim 3 wherein said beam combiner is a first beam combiner and wherein said EUV light source further comprises a second optic and a second beam combiner, the second beam combiner positioned on said first beam path between said first optic and said first optical gain medium to combine light travelling from said first optic and said second optic.

5. An EUV light source as recited in claim 3 wherein the first optic comprises a mirror.

6. An EUV light source as recited in claim 3 wherein the first optic comprises a grating.

7. An EUV light source as recited in claim 6 wherein the grating defines a groove direction and said EUV light source further comprises an actuator coupled with said grating to rotate said groove direction about said first beam path.

8. An EUV light source as recited in claim 4 wherein said first optic comprises a grating and said second optic comprises a grating.

9. An EUV light source as recited in claim 1 further comprising a variable attenuator attenuating light on said first beam path.

10. An EUV light source as recited in claim 9 wherein said variable attenuator comprises a polarization compensation device.

11. An EUV light source as recited in claim 1 wherein the beam combiner comprises a polarization beam combiner.

12. An EUV light source comprising;
a first optical gain medium amplifying light on a first beam path, said light on said first beam path having a first linear polarization direction, said first beam path being part of a first optical cavity disposed between a target material irradiation site and a first optics;
a second optical gain medium amplifying light on a second beam path, said light on said second beam path having a second polarization direction, said second beam path being part of a second optical cavity disposed between said target material irradiation site and said first optics;
a first beam combiner diverting a portion of light from the first beam path to a second beam path and through the second optical gain medium; and
a second beam combiner combining light on said first beam path and said second beam path to irradiate with said light after said combining a target material droplet at said target material irradiation site and generate EUV light emitting plasma.

13. An EUV light source as recited in claim 12 further comprising a third optical gain medium amplifying photons on the first beam path and the second beam path.

14. An EUV light source as recited in claim 12 further comprising a variable attenuator attenuating light on said first beam path.

15. An EUV light source as recited in claim 12 wherein said variable attenuator comprises a polarization compensation device.

16. An EUV light source as recited in claim 12 wherein the beam combiner comprises a polarization beam combiner.

17. A method for generating EUV light, said method comprising the steps of:
amplifying light on a first beam path with a first optical gain medium, said light on said first beam path having a first linear polarization direction, said first beam path being part of a first optical cavity disposed between a target material irradiation site and a first optics;
amplifying light on a second beam path with a second optical gain medium, said light on said second beam path having a second polarization direction, said second beam path being part of a second optical cavity disposed between said target material irradiation site and said first optics;
diverting a portion of light from the first beam path to a second beam path and through the second optical gain medium; and
combining light on said first beam path and said second beam path to irradiate with said light after said combining a target material droplet at said target material irradiation site and generate EUV light emitting plasma.

18. A method as recited in claim 17 further comprising the step of amplifying photons on the first beam path and the second beam path with a third optical gain medium.

19. A method as recited in claim 17 further comprising the step of attenuating light on said first beam path with a variable attenuator.

20. A method as recited in claim 17 wherein the diverting step is accomplished with a polarization beam combiner.

* * * * *